(12) United States Patent
Bachicha (10) Patent No.: US 12,044,159 B2
(45) Date of Patent: Jul. 23, 2024

(54) COOLANT STOP LOGIC

(71) Applicant: TOYOTA MOTOR ENGINEERING & MANUFACTURING NORTH AMERICA, INC., Plano, TX (US)

(72) Inventor: Mark A. Bachicha, Ann Arbor, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 0 days.

(21) Appl. No.: 18/051,204

(22) Filed: Oct. 31, 2022

(65) Prior Publication Data

US 2024/0141820 A1 May 2, 2024

(51) Int. Cl.
*F01P 7/16* (2006.01)
*F01P 7/14* (2006.01)
*H01M 10/613* (2014.01)
*H01M 10/625* (2014.01)
*H01M 10/63* (2014.01)
(Continued)

(52) U.S. Cl.
CPC .............. *F01P 7/16* (2013.01); *H01M 10/613* (2015.04); *H01M 10/625* (2015.04); *H01M 10/63* (2015.04); *H01M 10/663* (2015.04); *H05K 7/20845* (2013.01); *F01P 2007/146* (2013.01); *F01P 2025/08* (2013.01); *F01P 2025/64* (2013.01); *H01M 2220/20* (2013.01)

(58) Field of Classification Search
CPC .... F01P 7/16; F01P 2007/146; F01P 2025/08; F01P 2025/64; H01M 10/613; H01M 10/625; H01M 10/63; H01M 10/663; H01M 2220/20; H05K 7/20845
See application file for complete search history.

(56) References Cited

U.S. PATENT DOCUMENTS 5,791,316 A 8/1998 Houtz et al.
10,508,588 B2 12/2019 Kaneko et al.
(Continued)

FOREIGN PATENT DOCUMENTS

CN 111206981 A * 5/2020 ................ F01P 3/02
DE 102013201413 A1 8/2013
(Continued)

OTHER PUBLICATIONS

Machine Translation of JP 6687144 B1 PDF File Name: "JP6687144B1_Machine_Translation.pdf".*
(Continued)

*Primary Examiner* — Grant Moubry
*Assistant Examiner* — Ruben Picon-Feliciano
(74) *Attorney, Agent, or Firm* — Haynes and Boone, LLP (57) ABSTRACT

Method and systems for determining when to cancel coolant stop. An initial coolant temperature value is measured. The initial coolant temperature value is used to create Multiple Control Valve (MCV) opening thresholds. A first threshold is generated for MCV opening threshold for engine speed. A second threshold is generated for MCV opening for intake air mass flow. A comparison is made between the first threshold and the currently measured engine speed and/or a comparison is made between the second threshold and the currently measured intake air mass flow. The comparison(s) are then used to determine when to cancel coolant stop and open the MCV.

17 Claims, 6 Drawing Sheets

(51) Int. Cl.
*H01M 10/663* (2014.01)
*H05K 7/20* (2006.01)

(56) References Cited

U.S. PATENT DOCUMENTS 10,605,150 B2    3/2020    Toyama et al.
10,724,422 B2 *  7/2020    Hutchins .............. G05D 23/134

FOREIGN PATENT DOCUMENTS

| JP | 3760549 B2 | 3/2006 | |
| JP | 6687144 B1 * | 4/2020 | .............. F01P 11/16 |
| KR | 20170006141 A | 1/2017 | |
| WO | WO-2011124858 A1 * | 10/2011 | ............ B60W 40/02 |
| WO | WO 2011148464 A1 | 12/2011 | |

OTHER PUBLICATIONS

Machine Translation of CN 111206981 A PDF File Name: "CN111206981A_Machine_Translation.pdf".*
Machine Translation of WO 2011124858 A1 PDF File Name: "WO2011124858A1_Machine_Translation.pdf".*

* cited by examiner

COOLANT STOP LOGIC

FIELD

The present disclosure generally relates to an engine cooling system and, more particularly, to engine coolant stop logic for an automotive vehicle.

BACKGROUND

An engine cooling system circulates coolant through the engine system, which helps keep the engine system running at a substantially constant temperature. For example, the engine cooling system for a vehicle (e.g., an automotive vehicle) is used to dissipate heat and to allow the engine system to heat up as quickly as possible during operation. Typically, the coolant circulated through the engine system is a liquid, such as water. However, in other engine systems, the coolant is a gas.

Engine coolant stop systems keep coolant trapped in the engine during the warm-up of an engine. However, conventional systems prematurely cancel coolant stop when high air amounts are detected because conventional engine coolant stop systems uses a pre-determined air amount as the threshold for determining when to end the coolant stop. Additionally, these systems fail to consider the impact of friction as a function of temperature. Accordingly, the engine coolant stop system loses fuel economy and are less efficient through the use of pre-determined thresholds.

SUMMARY

In one example embodiment, a method for determining when to end the coolant stop is provided. An initial coolant temperature of a coolant in a vehicle cooling system is measured. A first threshold is determined using the initial coolant temperature. The first threshold corresponds to a valve opening threshold for intake air mass flow. An intake air mass flow value is measured and compared to the first threshold. In response to the comparison, a valve is opened if the measured intake air mass flow value exceeds the first threshold, wherein the valve opens to release the coolant.

In another example embodiment, a system includes a vehicle cooling system, wherein the vehicle cooling system comprises a coolant; an engine control unit; a sensor system; and a multiple control valve (MCV). The sensor system includes an air flow sensor that is in communication with the engine control unit; and a coolant temperature sensor that is also in communication with the engine control unit. The coolant temperature sensor measures an initial coolant temperature and sends the initial coolant temperature to the engine control unit. The air flow sensor measures an intake air mass flow value and sends the intake air mass flow value to the engine control unit. The engine control unit determines a first threshold using the initial coolant temperature. The first threshold corresponds to a MCV opening threshold for intake air mass flow. The engine control unit also compares the first threshold to a measured intake air mass flow value; and in response to the comparison, sends a command to open the MCV if the measured intake air mass flow value exceeds the first threshold, wherein the MCV opens to release the coolant of the vehicle cooling system.

In one example embodiment, a system that includes a vehicle cooling system, wherein the vehicle cooling system comprises a coolant; a controller; a sensor system; and a valve. The sensor system includes: an air flow sensor, a speed sensor, and a coolant temperature sensor. The sensor system is in communication with the controller. The valve is coupled to the vehicle cooling system. The coolant temperature sensor measures an initial coolant temperature of the coolant of the vehicle cooling system and sends the initial coolant temperature to the controller. The speed sensor measures an engine speed and sends the measured engine speed to the controller. The air flow sensor measures an intake air mass flow value and sends the measured intake air mass flow value to the controller. The controller determines a first threshold using the initial coolant temperature. The first threshold corresponds to a valve opening threshold for intake air mass flow and determines, using the initial coolant temperature, a second threshold, wherein the second threshold corresponds to a valve opening threshold for engine speed. The controller also compares the first threshold to the measured intake air mass flow value and the second threshold to the measured engine speed; and in response to the comparison, sending a command to open the valve if the measured intake air mass flow value exceeds the first threshold and/or if the measured engine speed exceeds the second threshold.

It is to be understood that both the foregoing general description and the following detailed description are exemplary and explanatory in nature and are intended to provide an understanding of the present disclosure without limiting the scope of the present disclosure. In that regard, additional aspects, features, and advantages of the present disclosure will be apparent to one skilled in the art from the following detailed description.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. In addition, the present disclosure may repeat reference numerals, letters, or both in the various examples. This repetition is for the purpose of simplicity and clarity and does not in itself dictate a relationship between the various embodiments and/or configurations discussed.

FIG. 5b is another portion of a flowchart of a method for determining when to open a Multiple Control Valve (MCV)

and for determining when to cancel coolant stop in accordance with one or more embodiments.

DETAILED DESCRIPTION

Illustrative embodiments and related methods of the present disclosure are described below as they might be employed in one or more methods and systems for determining when to cancel coolant stop in a vehicle. In the interest of clarity, not all features of an actual implementation or method are described in this specification. It will of course be appreciated that in the development of any such actual embodiment, numerous implementation specific decisions must be made to achieve the developers' specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure. Further aspects and advantages of the various embodiments and related methods of the disclosure will become apparent from consideration of the following description and drawings.

The example embodiments described below recognize that it may be desirable to have methods and systems that more efficiently manage when to cancel coolant stop, which will in turn increase fuel economy. In particular, the embodiments described below provide methods and systems for taking into account the impact of friction and its relationship to temperature in determining when to cancel coolant stop and determining when to cancel coolant stop based on an initial coolant temperature. Therefore, the methods and systems provide an improvement to engine coolant stop logic.

One or more embodiments described below provide methods and systems for considering the initial coolant temperature to determine an appropriate amount of air intake before allowing the engine coolant to flow out of the engine. When the initial coolant temperature is lower, the air intake threshold is higher, which allows the coolant to stay trapped for a longer period of time. When the initial engine coolant temperature is higher, then the air intake threshold is lower, which allows the coolant to flow out of the engine quicker. These methods and systems execute engine coolant stop control logic based on initial coolant temperature and an air intake amount. For example, when the initial coolant temperature is lower, the air intake threshold (e.g., a Multiple Control Valve (MCV) opening threshold for intake air mass flow) is higher which allows the coolant to stay trapped for a longer period of time. However, when the initial coolant temperature is higher, the air intake threshold is lower, which allows the coolant to flow out of the engine quicker.

One or more illustrative embodiments described below provide methods and systems by considering the relationship between friction and temperature. For example, friction is higher during cold conditions, therefore, a larger air intake threshold would be better when the initial coolant temperature is low. By executing engine coolant stop control logic based on engine coolant temperature and an air intake amount, the engine cooling may be more accurately performed.

Figure 1:
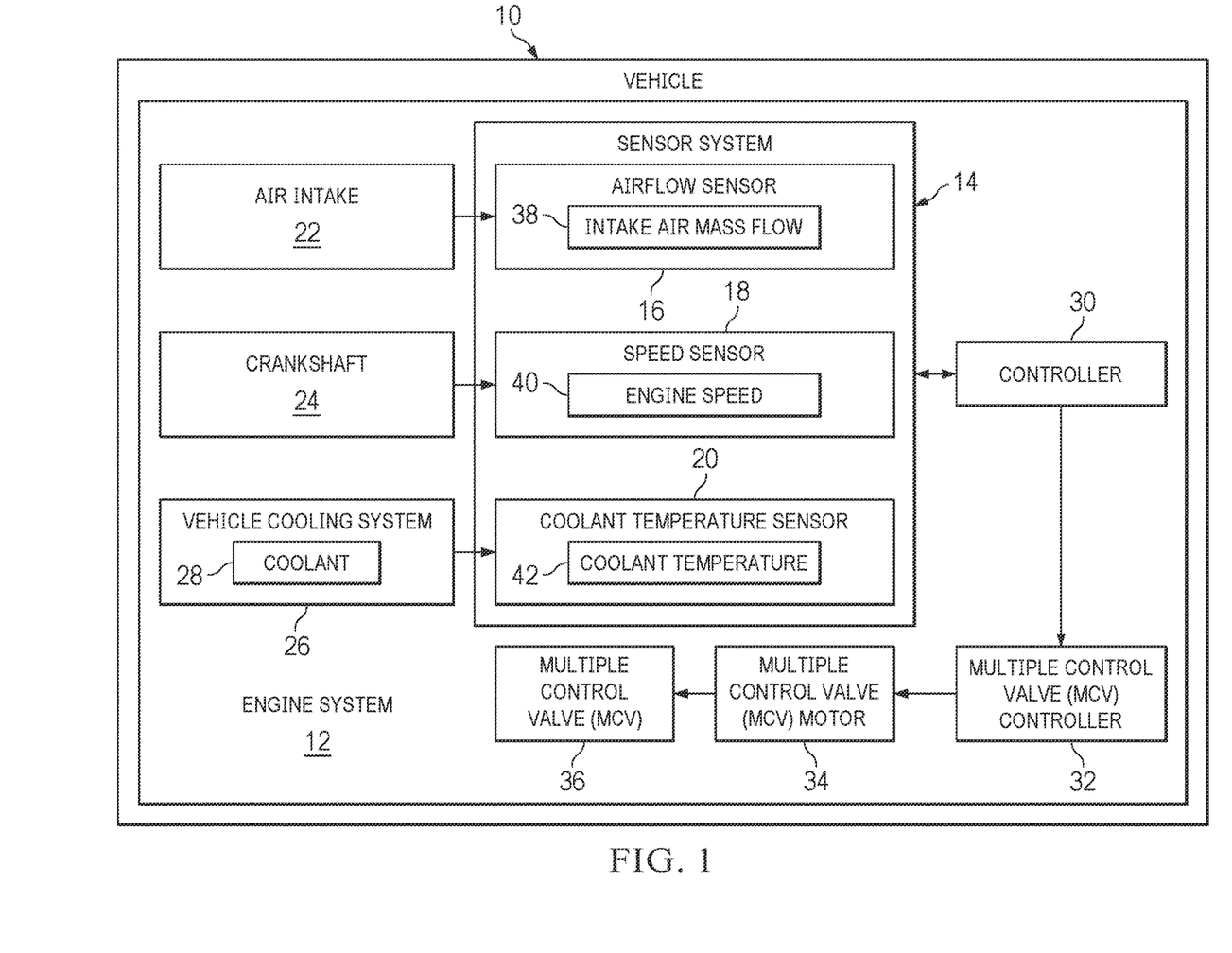
FIG. 1 is a block diagram depicting a vehicle in accordance with one or more embodiments.

Referring to FIG. 1, in an embodiment, a vehicle is generally referred to by reference numeral 10. In one example embodiment, vehicle 10 is an automotive vehicle. Vehicle 10 includes an engine system 12. The engine system 12 includes a sensor system 14. The sensor system 14 includes an air flow sensor 16, a speed sensor 18, and a coolant temperature sensor 20. The engine system 12 also includes an air intake 22, a crankshaft 24, and a vehicle cooling system 26. The air flow sensor 16 is operatively coupled to the air intake 22. The speed sensor is operatively coupled to the crankshaft 24. The coolant temperature sensor 20 is operatively coupled to the vehicle cooling system 26. The vehicle cooling system 26 includes coolant 28. The engine system 12 also includes a controller 30, a multiple control valve (MCV) controller 32, a multiple control valve (MCV) motor 34, and a multiple control valve (MCV) 36. The senor system 14 is in communication with the controller 30. The controller 30 is in communication with the MCV controller 32. The MCV controller 32 is in communication with and/or operatively coupled to the MCV motor 34. The MCV motor 34 is operatively coupled to the MCV 36.

In some embodiments, the engine system 12 includes an engine that may convert a fuel into mechanical power. The engine system 12 may include a gasoline engine, a diesel engine, or the like. The engine system 12 may also include a battery that may store electrical energy. The battery may include one or more energy storage devices including a battery, a super-capacitor, or other energy storage devices. In some embodiments, the engine system 12 may include a motor or generator. For example, the motor may convert the electrical energy stored in the battery into mechanical power usable to propel the vehicle. In some embodiments, the vehicle cooling system 26 is used to cool the engine; in other embodiments, the vehicle cooling system 26 is used to cool the battery; in other embodiments, the vehicle cooling system 26 is used to cool a motor; and in yet another embodiment, the vehicle cooling system 26 may be used to cool one or more of: engine, battery, or motor.

Sensor system 14 includes one or more sensors or sensor devices in communication with each other. Each of the sensors in sensor system 14 may be comprised of one or more sensors or sensor devices. In some embodiments, the sensor system 14 additionally includes a temperature sensor. The temperature sensor may be one or more temperature sensors capable of detecting data usable to determine an ambient temperature within a portion of the vehicle 10 or outside the vehicle 10. For example, the temperature sensor may include a thermocouple, a thermometer, an infrared temperature sensor, a thermistor or the like. The ambient temperature is sent to the controller 30. The controller 30 in some embodiments may use the ambient temperature in determining when to send a command to the MCV controller 32 to send a command to the MCV motor 34 to open the MCV 36. In some embodiments, by considering ambient temperature, the warmup process occurs faster.

Air flow sensor 16 is operatively coupled to air intake 22 to measure air amount entering an engine (intake air mass flow 38). In one or more examples, air flow sensor 16 is also referred to as an intake air mass flow sensor. In some embodiments, air flow sensor 16 is also used to measure air intake temperature. In one or more embodiments, air flow sensor 16 may include a single sensor capable of measuring engine air amount and air intake temperature. In other embodiments, air flow sensor 16 may include a sensor measuring air intake temperature and a different sensor for measuring engine air amount. In still other examples, air intake temperature may be measured using some other sensor other than air flow sensor 16.

The speed sensor 18 may be any speed sensor capable of detecting data usable to determine a speed associated with a vehicle 10. In some embodiments, the speed sensor 18 may be coupled to crankshaft 24 of an engine to measure engine speed 40. In other embodiments, speed sensor 18 is instead operatively coupled to a component of the motor such that the speed sensor 18 may be used to measure motor speed, rather than engine speed 40.

The coolant temperature sensor 20 is operatively coupled to the vehicle cooling system 26. In some embodiments, the coolant temperature sensor 20 may include a thermocouple, a thermometer, an infrared temperature sensor, a thermistor, or the like. The coolant temperature sensor 20 is used to measure coolant temperature 42. In some embodiments, the vehicle cooling system 26 cools an engine. In other embodiments, the vehicle cooling system 26 is used for cooling a battery. In yet another embodiment, the vehicle cooling system 26 cools a motor. In one or more embodiments, the coolant 28 is circulated through an engine by the vehicle cooling system 26. Coolant 28 is comprised of one or more fluids. A fluid, as used herein, may be a liquid or a gas. For example, coolant 28 may include water, air, or some other type of coolant.

In some embodiments, the controller 30 may be an engine control unit (ECU). The ECU may be operatively coupled to and/or in communication with each of the components (e.g., sensor system 14 and MCV controller 34) of the vehicle 10 and may include one or more processors and/or controllers which may be specifically designed for automotive systems. The functions of the ECU may be implemented by a single ECU or a plurality of ECUs. The ECU may receive data from components of the vehicle to, such as the sensor system 14, and may control the operation of components such as the MCV 36 (via the MCV controller 32 and the MCV motor 34) based on the determinations. In that regard, the ECU may control various aspects of the vehicle 10. In some embodiments, the controller 30 (or ECU) may include memory. The memory may be any non-transitory memory known in the art. The memory may store machine-readable instructions usable by the controller 30 (or ECU) and may store other data as requested by the ECU. The memory may be separate from the controller 30 but in communication with the controller 30. In some embodiments, the controller 30 may be coupled to, part of, or otherwise associated with engine system 12. In other embodiments, the controller 30 may be implemented using a cloud that is communicatively coupled to sensor system 14 and/or the vehicle cooling system 26. The controller 30 may be in communication with and/or operatively coupled to the coolant temperature sensor 20, the air flow sensor 16, the speed sensor 18, and the MCV controller 32.

In some embodiments, the MCV controller 32 is or acts as a thermostat. The MCV controller 32 is in communication with the MCV motor 34. In some embodiments, the MCV controller 32 is operatively coupled to the MCV motor 34. The MCV motor 34 may be operatively coupled to the MCV 36 to actuate the opening of the MCV 36. In some embodiments, the MCV 36 is a different type of valve. In other embodiments MCV 36 is a plurality of valves (e.g., MCVs).

The illustration of vehicle 10 in FIG. 1 is not meant to imply physical or architectural limitations to the manner in which an example embodiment may be implemented. Other components in addition to or in place of the ones illustrated may be used. Some components may be optional. Also, some blocks are presented to illustrate functional components. One or more of the blocks in FIG. 1 may be combined, divided, or combined and divided into different blocks when implemented in an example embodiment In operation, with continuing reference to FIG. 1, the air flow sensor 16 measures intake air mass flow 38 from the air intake 22 and communicates a value, signal, and/or data related to intake air mass flow 38 to the controller 30. The speed sensor 18 measures the engine speed 40 from the crankshaft 24 and communicates a value, signal, and/or data related to the engine speed 40 to the controller 30. The coolant temperature sensor 20 measures the coolant temperature 42 of the coolant 28 of the vehicle cooling system 26. The coolant temperature 42 may be an initial measured temperature value and/or the measured temperature value when the engine is started (beginning of a key on cycle). The coolant temperature sensor 20 communicates a value, signal, and/or data related to coolant temperature 42 to the controller 30. The controller 30 is in communication with the MCV controller 32 and sends commands to the MCV controller 32 to open the MCV 36 using the MCV motor 34. The MCV controller 32 may send a command to the MCV motor 34 to operate in order to open and/or close the MCV 36. The controller 30 may use the information from the air flow sensor 16, the speed sensor 18, and the coolant temperature sensor 20 to determine when to instruct the MCV controller 32 to command the MCV 36 to open. The controller 30 may also determine a threshold or a plurality of thresholds for opening the MCV 36 using the values, signals, and/or data from the sensor system 14, rather than using a pre-determined or pre-set threshold value for opening the MCV 36.

Figure 2:
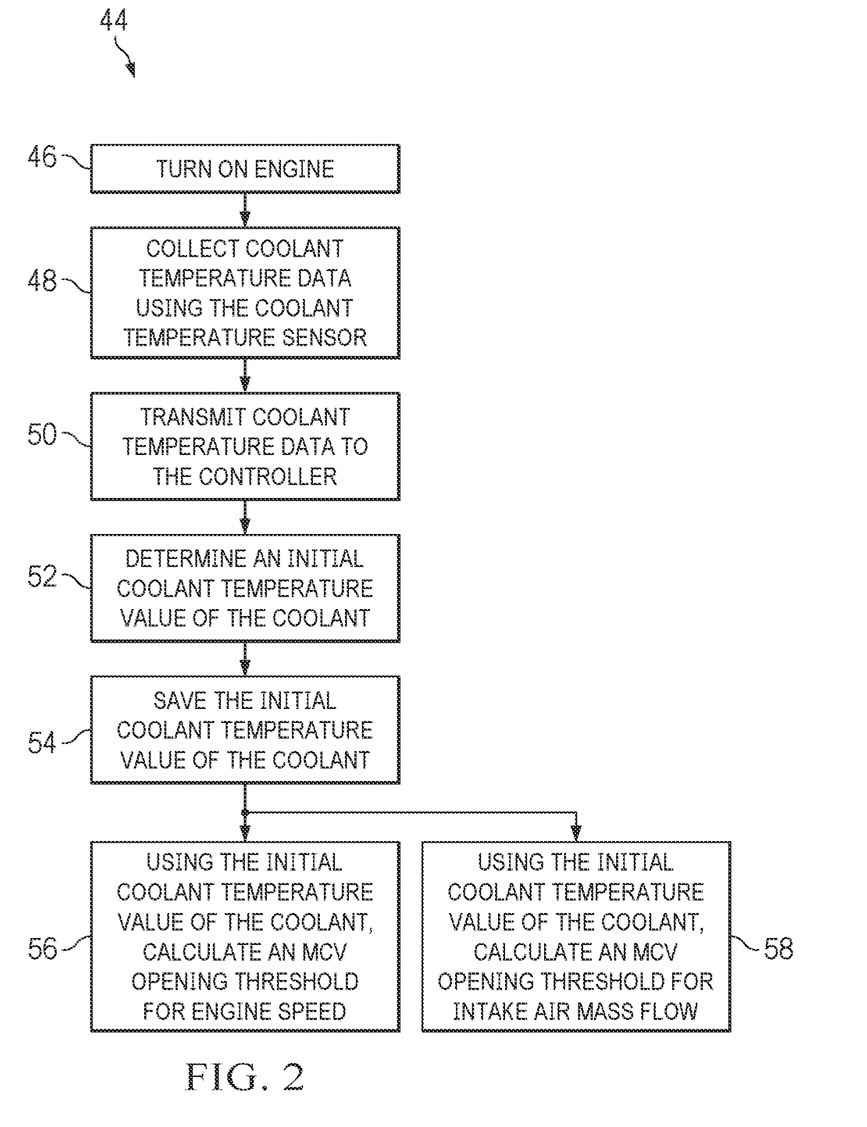
FIG. 2 is a flowchart of a method for determining a MCV opening threshold for engine speed and a Multiple Control Valve (MCV) opening threshold for intake air mass flow based on an initial coolant temperature in accordance with one or more embodiments

With reference to FIG. 2 and continuing reference to FIG. 1, a method 44 for determining a MCV opening threshold for engine speed and a Multiple Control Valve (MCV) opening threshold for intake air mass flow based on an initial coolant temperature, according to one or more embodiments. Method 44 is illustrated as a set of operations or blocks 46 through 58 and is described with continuing reference to FIG. 1. Not all of the illustrated blocks 46 through 58 may be performed in all embodiments of method 44. One or more blocks that are not expressly illustrated in FIG. 2 may be included before, after, in between, or as part of the blocks 46 through 48. In some embodiments, one or more of the blocks 46 through 58 may be implemented, at least in part, by the controller 30, in the form of executable code stored on non-transitory, tangible, machine-readable media that when run by one or more processors may cause the one or more processors to perform one or more of the processes. In one or more embodiments, the blocks in method 44 are performed within a vehicle, such as vehicle 10 in FIG. 1, by a controller 30, such as an ECU, such as the controller 30 in FIG. 1.

In an example embodiment, the method 44 includes: turning an engine on at a block 46; collecting coolant temperature data using the coolant temperature sensor 20 at a block 48; transmitting coolant temperature data to the controller 30 at a block 50; determining an initial coolant temperature value of the coolant 28 at a block 52; saving the initial coolant temperature value of the coolant 28 at a block 54; using the initial coolant temperature value of the coolant 28 to calculate an MCV opening threshold for engine speed 40 at a block 56; and using the initial coolant temperature value of the coolant 28 to calculate an MCV opening threshold for intake air mass flow 38 at a block 58.

In some embodiments, engine on or starting an engine key-on cycle automatically initiates the blocks 48-58. In some embodiments, the coolant temperature data comprises the coolant temperature 42. In other embodiments, the coolant temperature data comprises a plurality of coolant temperatures over a period of time. In some embodiments, the engine ON automatically causes the coolant temperature sensor to begin collecting coolant temperature data.

In some embodiments, the controller 30 determines the initial coolant temperature value of the coolant 28 from the coolant temperature data sent from the coolant temperature sensor 20 at the block 50. In other embodiments, a separate device such as the coolant temperature sensor 20 determines the initial coolant temperature value from the coolant temperature data and then transmits the initial coolant temperature value to the controller 30. In some embodiments, the block 52 occurs before the block 50.

In one or more embodiments, the controller 30 saves the initial coolant temperature value of the coolant 28 at the block 54. For example, the controller 30 may have a memory component such as RAM, ROM, Flash, or EEPROM to enable storing temperatures. In other embodiments, the controller 30 transmits the initial coolant temperature value to a memory separate from the controller 30 for storage.

In some embodiments, the block 56 occurs simultaneously or contemporaneously to the block 58. In other embodiments, the block 56 occurs but not the block 58. In yet another embodiment, the block 58 occurs but not the block 56. In some embodiments, the block 58 occurs prior to the block 56.

Figure 3:
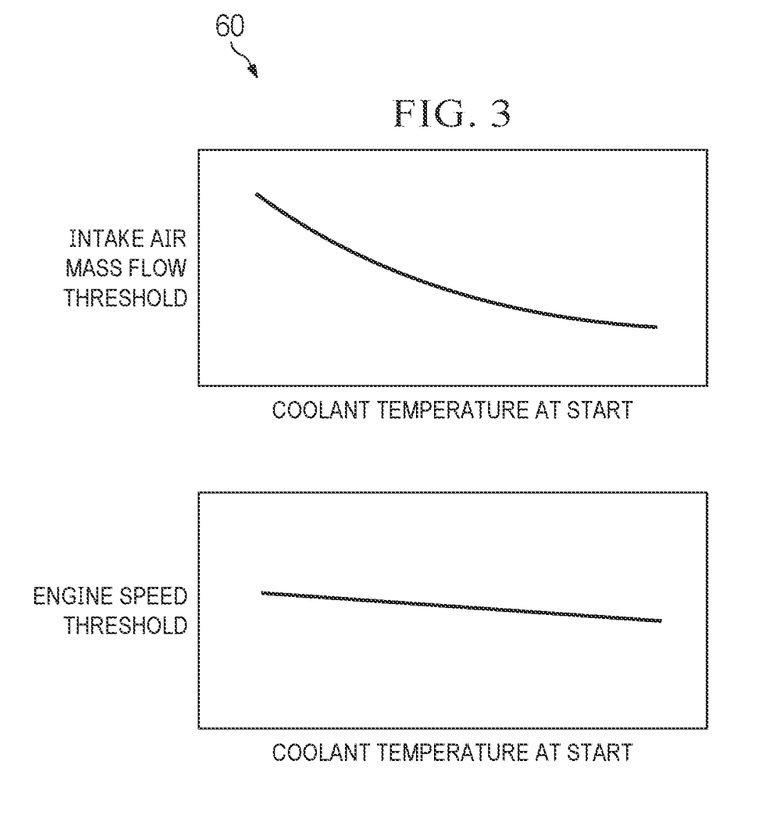
FIG. 3 is an illustration of a relationship between a coolant temperature at a start of an engine and a MCV opening threshold for intake air mass flow and a relationship between a coolant temperature at a start of an engine and a MCV opening threshold for engine speed in accordance with one or more embodiments.

Referring to FIG. 3, with continuing reference to FIGS. 1 and 2, reference numeral 60 shows an example graph showing the relationship between intake air mass flow threshold and the initial coolant temperature value (or coolant temperature at start) and an example graph showing the relationship between engine speed threshold and initial coolant temperature value (or coolant temperature at start). The air mass flow threshold is the MCV opening threshold for intake air mass flow. The engine speed threshold is the MCV opening threshold for engine speed. At the block 56 of the method 44, the controller 30 calculates using the initial coolant temperature value of the coolant 28, an MCV opening threshold for engine speed 40. At the block 58 of the method 44, the controller 30 calculates using the initial coolant temperature value of the coolant 28, an MCV opening threshold for intake air mass flow 38. The MCV opening threshold for intake air mass flow 38 may be a value or a range of values. The MCV opening threshold for engine speed 40 may be a value or a range of values.

In some embodiments, the one or more MCV opening thresholds (e.g., the MCV opening threshold for engine speed 40 and the MCV opening threshold for intake air mass flow 38) may be a value that if exceeding requires MCV 36 to be opened. In some embodiments, as shown in FIG. 3, the initial coolant temperature value is used to set the intake air mass flow threshold (e.g., MCV opening threshold for intake air mass flow 38) and the engine speed threshold (e.g., the MCV opening threshold for engine speed 40). Therefore, a higher initial coolant temperature value at first start-up of the engine will have a different threshold value for both the intake air mass flow threshold and the engine speed threshold than a second start-up of the engine with a lower initial coolant temperature value. Each engine ON/start of the engine may dynamically change the MCV opening threshold for intake air mass flow 38 and the MCV opening threshold for engine speed 40, as the initial coolant temperature values change. Therefore, the time to open the MCV 36 for each engine ON/start of the engine will change depending on the initial temperature value. In some embodiments, the one or more MCV opening thresholds are a difference or deviation between a current condition of the engine system 12 at a current point in time and a previous condition of engine system 12 at a previous point in time. The current condition may include the intake air mass flow 38, engine speed 40, coolant temperature 42, or another condition such as ambient temperature. In some embodiments, the previous point in time is the time immediately after the engine is turned on. In some embodiments, the previous point in time may be at a predetermined time interval before the current point in time. In one or more example embodiments, this time interval may be fixed. For example, the predetermined time interval may be 1 second, 5 seconds, 30 seconds, 1 minute, 5 minutes, 10 minutes, 30 minutes, or some other interval of time before the current point in time.

In some embodiments, the controller 30 uses the data provided by other sensors in sensor system 14 to identify one or more threshold values for opening the MCV 36.

Figure 4:
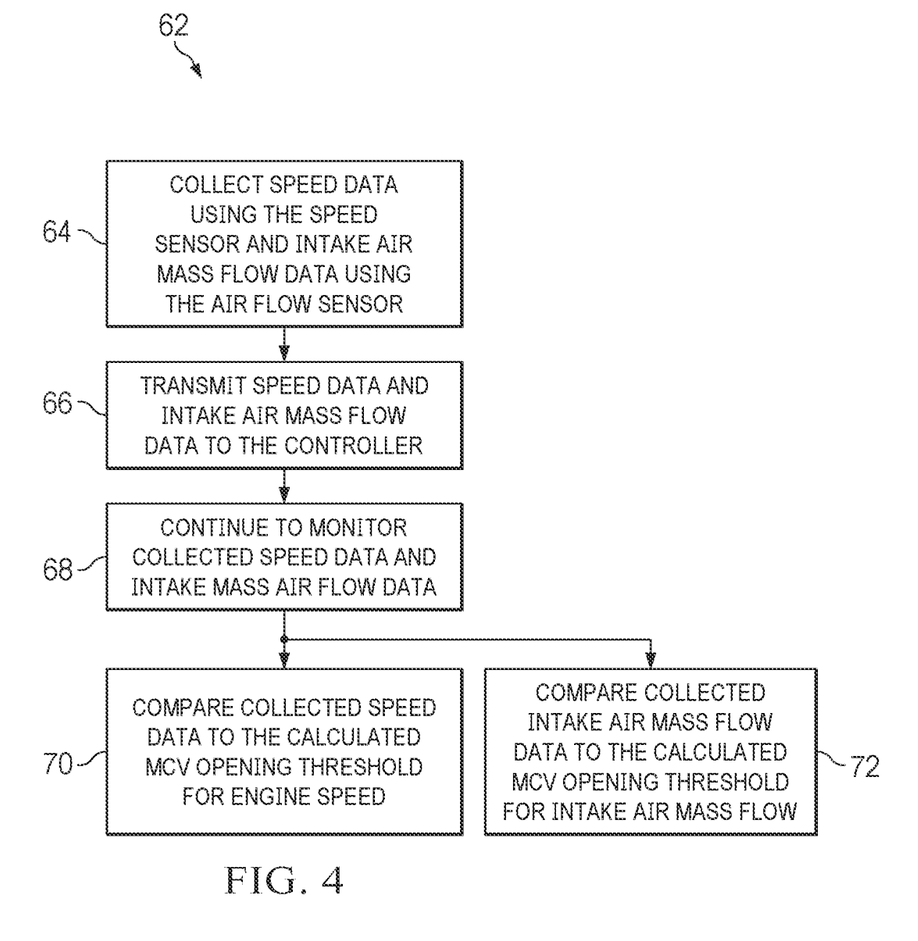
FIG. 4 is a flowchart of a method for comparing measured engine speed and/or measured intake air mass flow to the determined MCV opening thresholds for engine speed and for intake air mass flow, respectively, in accordance with one or more embodiments.

Referring now to FIG. 4, with continuing reference to FIGS. 1-3, FIG. 4 is a flowchart of a method 62 for monitoring speed data and intake air mass flow data and comparing the respective data to the determined MCV opening thresholds for engine speed and for intake air mass flow, respectively, in accordance with an example embodiment. Method 62 is illustrated as a set of operations or blocks 64 through 72 and is described with continuing reference to FIGS. 1-3. Not all of the illustrated blocks 64 through 72 may be performed in all embodiments of method 62. One or more blocks that are not expressly illustrated in FIG. 4 may be included before, after, in between, or as part of the blocks 64 through 72. In some embodiments, one or more of the blocks 64 through 72 may be implemented, at least in part, by the controller 30 in the form of executable code stored on non-transitory, tangible, machine-readable media that when run by one or more processors may cause the one or more processors to perform one or more of the processes.

In one or more embodiments, the blocks in method 62 are performed within a vehicle, such as vehicle 100 in FIG. 1, by the controller 30 such as in FIG. 1, or an ECU. Further, method 62 is an example of a more detailed process of the process described in method 44 in FIG. 2, and in some embodiments, the method 62 follows method 44. In other embodiments, method 62 is separate method from method 44.

In an example embodiment, method 62 includes the blocks 46 through 58 from method 44; a block 64 of collecting speed data using the speed sensor 18 and intake air mass flow data using the air flow sensor 16; a block 66 of transmitting speed data and intake air mass flow data to the controller 30; a block 68 of continuing to monitor collected speed data and intake air mass flow data; a block 70 of comparing collected speed data to the calculated MCV opening threshold for engine speed 40, and a block 72 of comparing collected intake air mass flow data to the calculated MCV opening threshold for intake air mass flow 38.

In another example embodiment, method 62 includes block 64 of collecting speed data using the speed sensor 18 and intake air mass flow data using the air flow sensor 16; block 66 of transmitting speed data and intake air mass flow data to the controller 30; block 68 of continuing to monitor collected speed data and intake air mass flow data; block 70 of comparing collected speed data to the calculated MCV opening threshold for engine speed 40, and block 72 of comparing collected intake air mass flow data to the calculated MCV opening threshold for intake air mass flow 38.

In some embodiments, in the block 64, collecting speed data using the speed sensor 18 is a separate block from collecting intake air mass flow data using the air flow sensor 16 and the collecting of speed data and intake air mass flow data occurs at different times and/or different time intervals. In some embodiments, collecting speed data occurs simultaneously and/or contemporaneously to collecting intake air mass flow data. In some embodiments, speed data is engine speed 40. In one or more embodiments, a plurality of engine speeds 40 are collected over a period of time. In some embodiments, intake air mass flow data is intake air mass flow 38. In other embodiments, a plurality of intake air mass flow values are collected over a period of time. In some embodiments, the speed data and the intake air mass flow data are sent continuously or incrementally to the controller 30 until the MCV 36 is opened. In some embodiments, only the speed sensor 18 measures and collects engine speed 40 to be sent as a compiled plurality of engine speeds to the controller 30; in other embodiments, the speed sensor 18 measures the engine speed 40 and sends the engine speed 40 to the controller 30 where the engine speed 40 is collected. In some embodiments, only the air flow sensor 16 measures and collects intake air mass flow 38 to be sent as a plurality of intake air mass flows to the controller 30; in other embodiments, the air flow sensor 16 measures the intake air mass flow 38 and sends the intake air mass flow 38 to the controller 30 to be collected. In some embodiments, the block 66 occurs before or contemporaneously to block 64. In some embodiments, only speed data is sent to the controller 30. In other embodiments, only intake air mass flow is sent to the controller 30.

In some embodiments, the block 68 is omitted. In some embodiments, the block 68 occurs automatically. In some embodiments, continue to monitor means to continue to measure. In other embodiments, continue to monitor means continue to measure and compare the respective data to the respective thresholds. In other embodiments, the block 68 occurs automatically after a pre-set time period. After a pre-set time period, a new engine speed 40 is measured and transmitted to the controller 30 and a new intake air mass flow 38 is measured and transmitted to the controller 30. In some embodiments, the pre-set time period is different for measuring engine speed 40 and measuring intake air mass flow 38. In some embodiments, a pre-set time is not used, rather the sensors are constantly measuring engine speed 40 and intake air mass flow 38 until the MCV 36 is opened. In some embodiments, the engine speed 40 and intake air mass flow 38 are measured after the MCV 36 is opened but the controller 30 is no longer using the data to determine when to open the MCV 36.

In some embodiments, the block 70 occurs after or contemporaneously to the block 72. In other embodiments, the block 70 or the block 72 is omitted. In the block 70, the collected speed data is compared to the calculated MCV opening threshold for engine speed 40. In the block 72, the intake air mass flow data is compared to the calculated MCV opening threshold for the intake air mass flow.

Figure 5A:
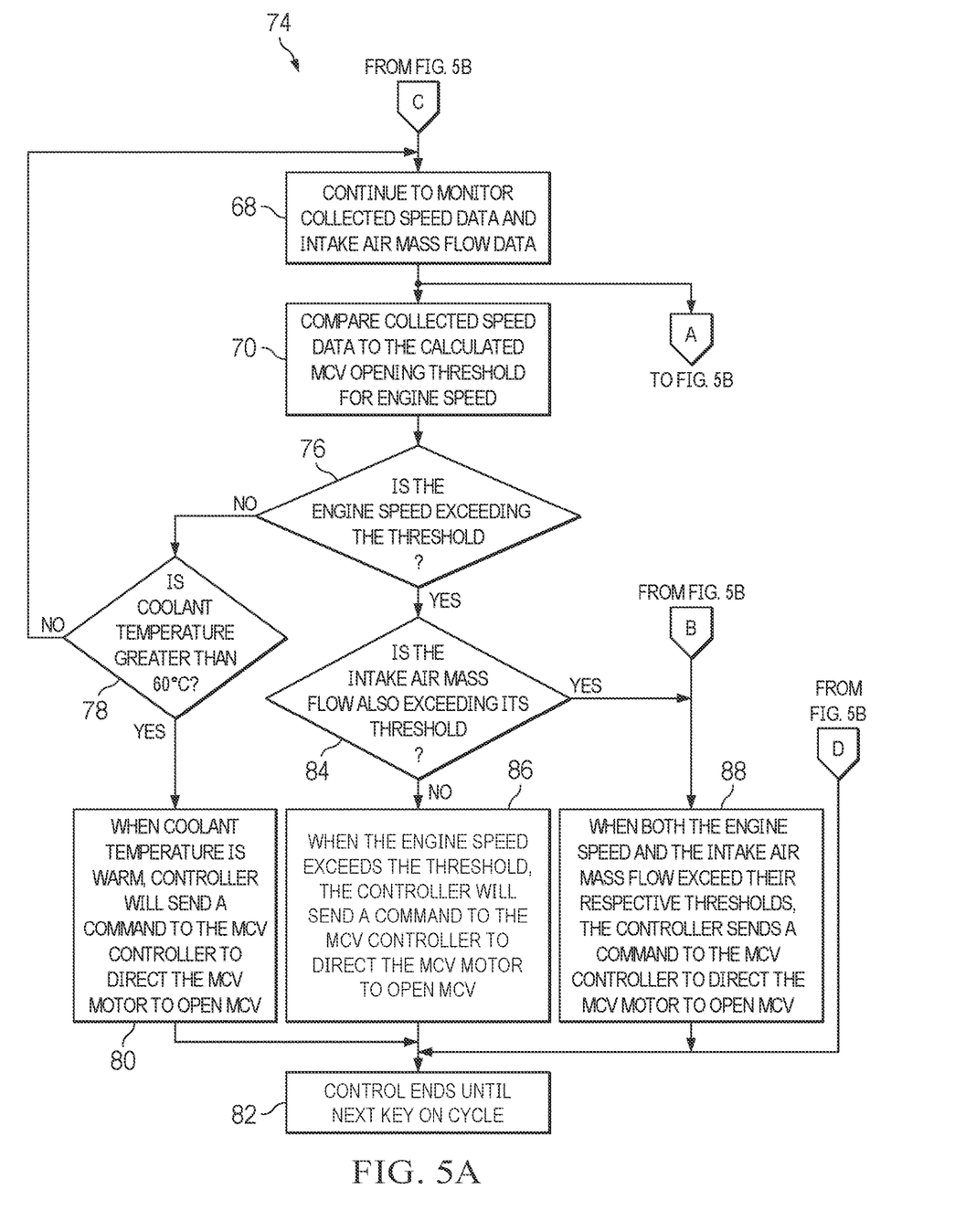
FIG. 5a is a portion of a flowchart of a method for determining when to open a Multiple Control Valve (MCV) and for determining when to cancel coolant stop in accordance with one or more embodiments.
Figure 5B:
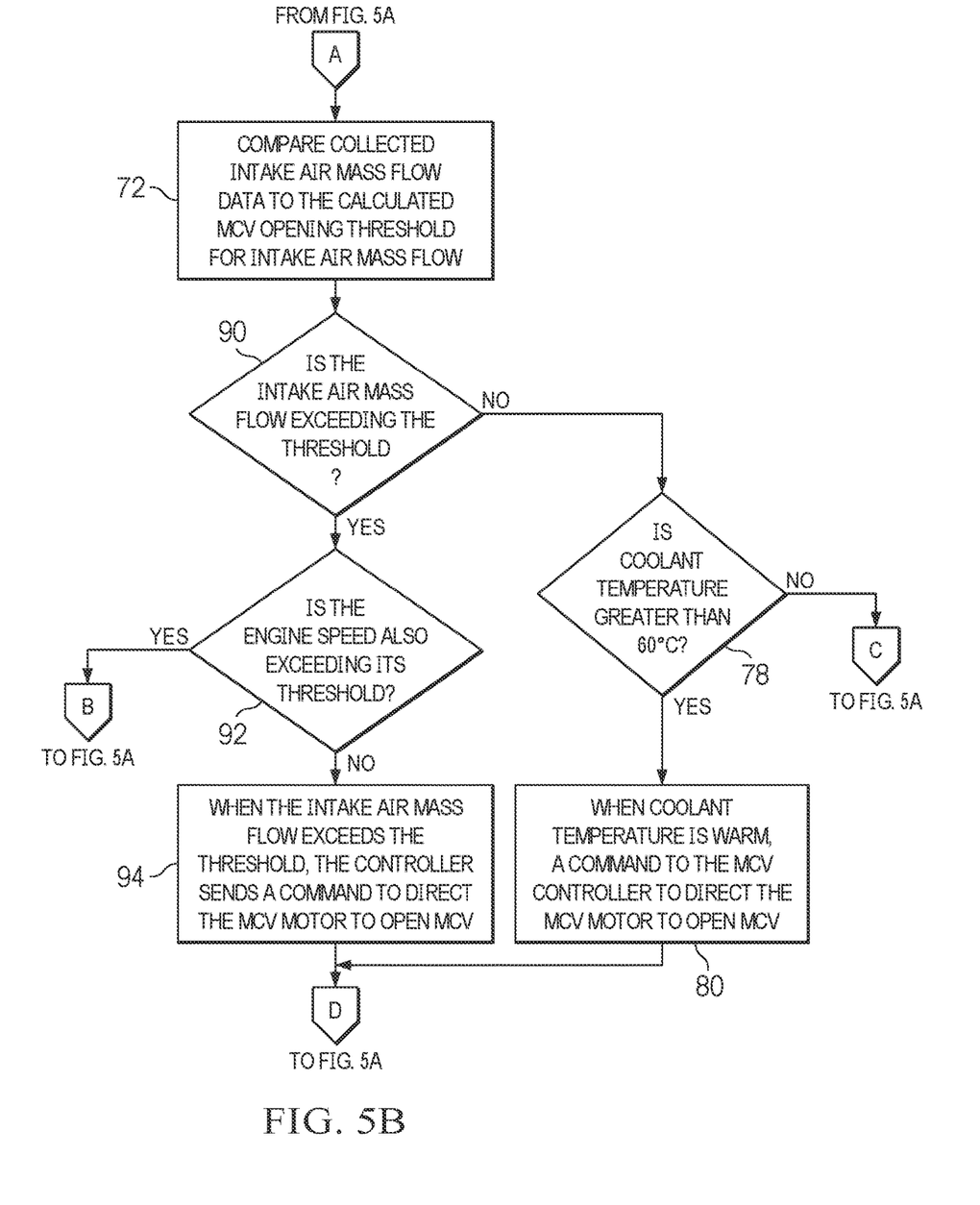

Referring now to FIGS. 5a and 5b, with continuing reference to FIGS. 1-4, FIGS. 5a and 5b are a flowchart of a method 74 for monitoring engine speed 40, intake air mass flow 38, and coolant temperature 42 and for determining when to open the MCV 36 and stop control in accordance with an example embodiment. Method 74 is illustrated as a set of operations or blocks 68 through 94 and is described with continuing reference to FIGS. 1-4. Not all of the illustrated blocks 68 through 94 may be performed in all embodiments of method 74. One or more blocks that are not expressly illustrated in FIGS. 5a and 5b may be included before, after, in between, or as part of the blocks 68 through 94. In some embodiments, one or more of the blocks 68 through 94 may be implemented, at least in part, by the controller 30 in the form of executable code stored on non-transitory, tangible, machine-readable media that when run by one or more processors may cause the one or more processors to perform one or more of the processes.

In one or more embodiments, the blocks in method 74 are performed within a vehicle, such as vehicle 100 in FIG. 1, by the controller 30 such as in FIG. 1, or an ECU. Further, method 74 is an example of a more detailed process of the process described in method 44 in FIG. 2 and method 62 in FIG. 4, and in some embodiments, the method 74 follows methods 44 and 62 respectively. In other embodiments, method 74 is separate method from method 44 and/or method 62.

In an example embodiment, method 74 includes continuing to monitor collected speed data and intake air mass flow data in the block 68; comparing collected speed data to the calculated MCV opening threshold for engine speed 40 at the block 70; comparing collected intake air mass flow data to the calculated MCV opening threshold for intake air mass flow 38 at the block 72; in comparing the collected speed data to the calculated MCV opening threshold for engine speed 40, the system determines whether the engine speed 40 exceeds the threshold at the a block 76; if no (i.e., engine speed is below threshold), then the system determines whether the coolant temperature 42 greater than 60° C. at a block 78; if no (i.e., coolant temperature is less than 60° C.) then proceed back to the block 68; if yes (i.e., coolant temperature is greater than 60° C.), then proceeds to a block 80, when coolant temperature 42 is warm, the controller 30 will send a command to the MCV Controller 32, which directs the MCV motor 34 to open the MCV 36; and once opened, a block 82 occurs, where control ends until next key on cycle. However, if the engine speed 40 is exceeding the threshold, then the system determines whether the intake air mass flow 38 also exceeds its respective threshold at a block 84, if no (intake air mass flow is below its threshold, while engine speed is exceeding its threshold), then proceed to a block 86, when the engine speed 40 exceeds the threshold, the controller 30 will send a command to the MCV controller 32, which directs the MCV motor 34 to open the MCV 36; and once opened, the block 82 occurs, where control ends until next key on cycle. However, if both the intake air mass flow 38 and the engine speed 40 are both exceeding the threshold, then proceed to a block 88, the controller 30 will send a command to the MCV Controller 32, which directs the MCV motor 34 to open the MCV 36; and once opened, the block 82 occurs, where control ends until next key on cycle. In comparing the collected intake air mass flow data to the calculated MCV opening threshold for intake air mass flow 38, the system determines whether the intake air mass flow exceeds the threshold at a block 90; if no (the intake air mass flow is below the threshold), then the system determines whether the coolant temperature 42 greater than 60° C. at the block 78; if no, then proceed back to the block 68. However, if yes (coolant is greater than then 60° C.) proceed to the block 80, when coolant temperature 42 is warm, the controller 30 will send a command to the MCV Controller 32, which directs the MCV motor 34 to open the MCV 36; and once opened, the block 82 occurs, where control ends until next key on cycle. However, if the intake air mass flow 38 exceeds the threshold, then the system determines if the Engine speed 40 also exceeds its threshold at a block 92. If not, then a block 94 occurs when the intake air mass flow 38 exceeds the threshold, the controller 30 will send a command to the MCV Controller 32, which directs the MCV motor 34 to open the MCV 36; and once opened, the block 82 occurs, where control ends until next key on cycle. However, if both the engine speed 40 and the air intake mass flow 38 exceed the threshold, then proceed to the block 88. At the block 88, both the engine speed and the intake air mass flow exceed their respective thresholds, the controller 30 then sends a command to the MCV controller 32 to direct the MCV motor 34 to open the MCV 36. Once the MCV 36 is opened, block 82 occurs which directs the control to end until the next key on cycle.

In some embodiments, the block 68 includes collecting new data for intake air mass flow 38 and engine speed 40. In other embodiments, the block 68 includes collecting and monitoring intake air mass flow data and speed data. In some embodiments, speed data includes motor speed, rather than engine speed. In some embodiments, the block 68 includes the sensor system 14 measuring engine speed 40 using speed sensor 18, intake air mass flow 38 using the air flow sensor 16, and the coolant temperature 42 using the coolant temperature sensor 20 and transmitting those measurements to the controller 30 for comparison to the calculated thresholds on when to open the MCV 36.

In some embodiments the block 70 occurs contemporaneously to or after the block 72. At the block 70, the controller 30 compares the collected speed data to the calculated MCV opening threshold for engine speed 40.

At the block 76, the controller 30 determines if the engine speed 40 exceeds the threshold. If not, the MCV 36 does not need to be opened yet, unless the block 78 or the block 90 has occurred. Therefore, the control and/or control logic needs to continue.

At the block 78, the controller 30 determines if the coolant 28 is warm. The block 78 may be overridden or omitted by an occurrence at the block 84 and/or the block 92. For example, if the engine speed does not exceed the threshold but the intake air mass flow 38 does exceed the threshold, then the block 78 may be omitted to end the control and proceed to the blocks 94 and 82. In some embodiments determining the current temperature of the coolant 28 happens contemporaneously to the block 70 and/or the block 72.

In some embodiments, the method 74 includes additional thresholds. In some embodiments, a third threshold is for coolant temperature 42. In other embodiments, coolant temperature 42 has a threshold of 60° C. such that when the coolant temperature reaches or exceeds 60° C. the coolant 28 is deemed warmed by the system, which ends the control until the next key on cycle. In other embodiments, the threshold is at or above 60° C. In some embodiments, a different value from 60° C. is selected for the coolant temperature to be deemed warmed by the system. In some embodiments, the third threshold is a pre-set or pre-determined value such as 60° C. The pre-set third threshold is stored in the controller 30. In other embodiments, the third threshold is calculated using the initial coolant temperature after block 54 in method 44. If no, the system and/or method loops back to the block 68 to continue collecting measurements/monitoring speed data and or air mass flow data. If yes, the coolant is deemed warm by the controller 30 at the block 80. The controller at the block 80 sends a command and/or instructions to the MCV controller 32 to direct the MCV motor 34 to open the MCV 36. In some embodiments, a fourth threshold is an MCV opening threshold for ambient temperature based on the initial coolant temperature 42.

If the intake air mass flow 38 is not exceeding its threshold (the calculated MCV opening threshold for intake air mass flow), while the engine speed 40 is exceeding its threshold, then the controller 30 will send a command to the MCV controller 32 to direct the MCV motor to open the MCV 36.

If the intake air mass flow 38 is exceeding its threshold (the calculated MCV opening threshold for intake air mass flow) and the engine speed 40 is exceeding its threshold (the calculated MCV threshold for engine speed 40), then the block 88 occurs, which also causes the controller 30 to send a command to the MCV controller 32 to direct the MCV motor to open the MCV 36.

If the intake air mass flow 38 is exceeding its threshold (the calculated MCV opening threshold for intake air mass flow) and the engine speed 40 is not exceeding its threshold (the calculated MCV threshold for engine speed 40), then the block 94 occurs, which also causes the controller 30 to send a command to the MCV controller 32 to direct the MCV motor to open the MCV 36

At the block 90, the controller 30 will determine if the intake air mass flow 38 exceeds its threshold (the calculated MCV opening threshold for intake air mass flow 38), if yes, the block 92 proceeds and the controller 30 will determine if the engine speed 40 is also exceeding its threshold (the calculated MCV threshold for engine speed 40). At the block 90, if the controller 30 determines that the intake air mass flow 38 is below its threshold, then the controller 30 will determine if the coolant temperature 42 is greater than 60° C. If the coolant temperature is greater than 60° C., then the coolant is warm and the MCV 36 is directed by the controller 30 via the MCV controller 32 and the MCV motor 34 to open.

If the coolant is not warm, the control will continue until either (1) coolant is warm, (2) Engine Speed 40 exceeds the calculated MCV threshold for engine speed 40, and/or (3) Intake Air Mass Flow 38 exceeds the calculated MCV opening threshold for intake air mass flow 38. When (1) coolant is warm, (2) Engine Speed 40 exceeds the calculated MCV threshold for engine speed 40, and/or (3) Intake Air Mass Flow 38 exceeds the calculated MCV opening threshold occurs the controller 30 will direct the MCV controller 32 to direct the MCV motor 34 to open the MCV 36. In some embodiments, the command from the controller 30 is sent from the controller 30 to the MCV controller 32 and then the MCV controller instructs the MCV motor 34 of the command which directs the MCV motor 34 to open the MCV 36.

In some embodiments, the controller 30 performs blocks 76, 78, 84, 90, and/or 92 simultaneously. In some embodiments, the blocks 72, 90, and/or 92 occurs prior to the blocks 70, 76, and/or 84.

When (1) coolant is warm, (2) Engine Speed 40 exceeds the calculated MCV threshold for engine speed 40, and/or (3) Intake Air Mass Flow 38 exceeds the calculated MCV opening threshold for intake air mass flow occurs, the block 82 occurs, and the control ends until the next key on cycle. In some embodiments, the next key on cycle is the next time that the engine is turned on.

In several example embodiments, the elements and teachings of the various illustrative example embodiments may be combined in whole or in part in some or all of the illustrative example embodiments. In addition, one or more of the elements and teachings of the various illustrative example embodiments may be omitted, at least in part, and/or combined, at least in part, with one or more of the other elements and teachings of the various illustrative embodiments.

Any spatial references such as, for example, "upper," "lower," "above," "below," "between," "bottom," "vertical," "horizontal," "angular," "upwards," "downwards," "side-to-side," "left-to-right," "right-to-left," "top-to-bottom," "bottom-to-top," "top," "bottom," "bottom-up," "top-down," etc., are for the purpose of illustration only and do not limit the specific orientation or location of the structure described above.

In several example embodiments, while different blocks, processes, and procedures are described as appearing as distinct acts, one or more of the blocks, one or more of the processes, and/or one or more of the procedures may also be performed in different orders, simultaneously, and/or sequentially. In several example embodiments, the blocks, processes and/or procedures may be merged into one or more blocks, processes, and/or procedures.

In several example embodiments, one or more of the operational blocks in each embodiment may be omitted. Moreover, in some instances, some features of the present disclosure may be employed without a corresponding use of the other features. Moreover, one or more of the above-described embodiments and/or variations may be combined in whole or in part with any one or more of the other above-described embodiments and/or variations.

The phrase "at least one of A and B" should be understood to mean "A; B; or both A and B." The phrase "one or more of the following: A, B, and C" should be understood to mean "A; B; C; A and B; B and C; A and C; or all three of A, B, and C." The phrase "one or more of A, B, and C" should be understood to mean "A; B; C; A and B; B and C; A and C; or all three of A, B, and C."

Although several example embodiments have been described in detail above, the embodiments described are examples only and are not limiting, and those skilled in the art will readily appreciate that many other modifications, changes, and/or substitutions are possible in the example embodiments without materially departing from the novel teachings and advantages of the present disclosure. Accordingly, all such modifications, changes, and/or substitutions are intended to be included within the scope of this disclosure as defined in the following claims. In the claims, any means-plus-function clauses are intended to cover the structures described herein as performing the recited function and not only structural equivalents, but also equivalent structures. Moreover, it is the express intention of the applicant not to invoke 35 U.S.C. § 112(f) for any limitations of any of the claims herein, except for those in which the claim expressly uses the word "means" together with an associated function.

What is claimed is:

1. A method comprising:
   measuring, using a coolant temperature sensor, an initial coolant temperature of a coolant in a vehicle cooling system;
   sending, using the coolant temperature sensor, the initial coolant temperature to an engine control unit;
   determining, during operation of a vehicle and using the initial coolant temperature and the engine control unit:
      a first threshold, wherein the first threshold corresponds to a valve opening threshold for intake air mass flow; and
      a second threshold, wherein the second threshold corresponds to a valve opening threshold for engine speed;
   measuring, using an air flow sensor, a first intake air mass flow value;
   sending, using the air flow sensor, the first intake air mass flow value to the engine control unit;
   measuring, using a speed sensor, a first engine speed;
   sending, using the speed sensor, the first engine speed to the engine control unit;
   comparing, using the engine control unit:
      the first threshold to the first intake air mass flow value; and
      the second threshold to the first engine speed; and
   sending, using the engine control unit and in response to the comparison, a first command to open a valve coupled to the vehicle cooling system if the first intake air mass flow value exceeds the first threshold and/or if the first engine speed exceeds the second threshold, wherein the valve opens to release the coolant.

2. The method of claim 1, further comprising:
   measuring a current temperature of the coolant if the first engine speed is below the second threshold and the first intake air mass flow value is below the first threshold.

3. The method of claim 2, further comprising:
   determining if the current temperature of the coolant exceeds a third threshold, wherein the third threshold is a pre-determined temperature value for the coolant.

4. The method of claim 3, further comprising:
   opening the valve if the current temperature of the coolant exceeds the third threshold.

5. The method of claim 4, further comprising:
   measuring a second engine speed and a second intake air mass flow value, if the current temperature of the coolant is below the third threshold;
   comparing the second engine speed to the second threshold and the second intake air mass flow value to the first threshold; and
   opening the valve if at least one of: the second engine speed exceeds the second threshold or the second intake air mass flow value exceeds the first threshold.

6. The method of claim 1, wherein the vehicle cooling system is used to cool at least one of: an engine, a motor, or a battery.

7. The method of claim 1, wherein turning an engine on initiates measuring initial coolant temperature of the coolant in the vehicle cooling system.

8. The method of claim 1, wherein the valve comprises a multiple control valve (MCV).

9. The method of claim 8, wherein opening the MCV further comprises:
   sending the first command to a MCV controller,
   sending a second command, from the MCV controller to a MCV motor; and
   opening the MCV using the MCV motor based on at least one of the first command or the second command.

10. A system comprising:
    a vehicle cooling system, wherein the vehicle cooling system comprises a coolant;
    an engine control unit;
    a sensor system, wherein the sensor system comprises:
       an air flow sensor;
       a speed sensor; and
       a coolant temperature sensor;
       wherein each of the air flow sensor, the speed sensor, and the coolant temperature sensor is in communication with the engine control unit; and
    a valve;
       wherein the coolant temperature sensor measures an initial coolant temperature and sends the initial coolant temperature to the engine control unit;
       wherein the speed sensor measures an engine speed and sends the measured engine speed to the engine control unit;
       wherein the air flow sensor measures an intake air mass flow value and sends the intake air mass flow value to the engine control unit; and
       wherein the engine control unit is configured to:
          determine, during operation of a vehicle and using the initial coolant temperature, a first threshold, wherein the first threshold corresponds to a valve opening threshold for intake air mass flow;

determine, during operation of the vehicle and using the initial coolant temperature, a second threshold, wherein the second threshold corresponds to a valve opening threshold for engine speed;

compare the first threshold to a measured intake air mass flow value and the second threshold to the measured engine speed; and in response to the comparison, sending a command to open the valve if the measured intake air mass flow value exceeds the first threshold and/or if the measured engine speed exceeds the second threshold, wherein the valve opens to release the coolant of the vehicle cooling system.

11. The system of claim 10, wherein the coolant temperature sensor is configured to measure a current temperature of the coolant if the measured engine speed is below the second threshold and the measured intake air mass flow value is below the first threshold.

12. The system of claim 11, wherein the engine control unit is further configured to:

determine if the current temperature of the coolant is at or exceeds a third threshold, wherein the third threshold is a pre-determined temperature value.

13. The system of claim 12, wherein the engine control unit is further configured to:

send a command to open the valve if the current temperature of the coolant is at or exceeds the third threshold.

14. The system of claim 10, wherein the vehicle cooling system is used to cool at least one of: an engine, a motor, or a battery.

15. A system comprising:

a vehicle cooling system, wherein the vehicle cooling system comprises a coolant;

a controller;

a sensor system, wherein the sensor system comprises:
an air flow sensor,
a speed sensor, and
a coolant temperature sensor, wherein the sensor system is in communication with the controller; and a valve coupled to the vehicle cooling system;

wherein the coolant temperature sensor measures an initial coolant temperature of the coolant of the vehicle cooling system and sends the initial coolant temperature to the controller;

wherein the speed sensor measures an engine speed and sends the measured engine speed to the controller;

wherein the air flow sensor measures an intake air mass flow value and sends the measured intake air mass flow value to the controller; and wherein the controller is configured to:

determine, using the initial coolant temperature, a first threshold, wherein the first threshold corresponds to a valve opening threshold for intake air mass flow; and determine, using the initial coolant temperature, a second threshold, wherein the second threshold corresponds to a valve opening threshold for engine speed;

compare the first threshold to the measured intake air mass flow value and the second threshold to the measured engine speed; and in response to comparing, sending a command to open the valve if the measured intake air mass flow value exceeds the first threshold and/or if the measured engine speed exceeds the second threshold.

16. The system of claim 15, further comprising:

a valve controller, wherein the valve controller is in communication with the controller; and a valve motor operably coupled to the valve and operably controlled by the valve controller.

17. The system of claim 16, wherein sending the command to open the valve further comprises:

sending the command to the valve controller, wherein the valve controller implements the command by directing the valve motor to open the valve.

* * * * *